(12) United States Patent
Shtein et al.

(10) Patent No.: US 7,419,846 B2
(45) Date of Patent: Sep. 2, 2008

(54) METHOD OF FABRICATING AN OPTOELECTRONIC DEVICE HAVING A BULK HETEROJUNCTION

(75) Inventors: Max Shtein, Princeton, NJ (US); Fan Yang, Princeton, NJ (US); Stephen R. Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 426 days.

(21) Appl. No.: 10/824,288

(22) Filed: Apr. 13, 2004

(65) Prior Publication Data

US 2005/0227406 A1 Oct. 13, 2005

(51) Int. Cl.
*H01L 51/48* (2006.01)
*H01L 51/42* (2006.01)

(52) U.S. Cl. .................. 438/82; 257/40; 257/E51.014; 136/263

(58) Field of Classification Search .................. 438/82, 438/99; 257/40, E51.014; 136/263
See application file for complete search history.

(56) References Cited

U.S. PATENT DOCUMENTS

| | | | |
|---|---|---|---|
| 5,482,570 A * | 1/1996 | Saurer et al. ................. 136/255 |
| 5,703,436 A | 12/1997 | Forrest et al. |
| 5,707,745 A | 1/1998 | Forrest et al. |
| 5,844,363 A | 12/1998 | Gu et al. |
| 6,084,176 A * | 7/2000 | Shiratsuchi et al. ......... 136/263 |
| 6,097,147 A | 8/2000 | Baldo et al. |
| 6,150,605 A * | 11/2000 | Han .......................... 136/263 |
| 6,198,092 B1 * | 3/2001 | Bulovic et al. ........... 250/214.1 |
| 6,278,055 B1 * | 8/2001 | Forrest et al. ................. 136/263 |
| 6,281,430 B1 | 8/2001 | Lupo et al. |
| 6,297,495 B1 | 10/2001 | Bulovic et al. |
| 6,303,238 B1 | 10/2001 | Thompson et al. |

(Continued)

OTHER PUBLICATIONS

Ishikawa, T., et al. "Preparation of Organic Bulk Heterojunction Photovoltaic Cells By Evaporation Spray Deposition From Ultradilute Solution." Appl. Phys. Lett. vol. 84 (Mar. 29, 2004): pp. 2424-2426.*

(Continued)

*Primary Examiner*—Bradley W. Baumeister
*Assistant Examiner*—Matthew W Such
(74) *Attorney, Agent, or Firm*—Kenyon & Kenyon LLP

(57) ABSTRACT

A method of fabricating an organic optoelectronic device having a bulk heterojunction comprises the steps of: depositing a first layer over a first electrode by organic vapor phase deposition, wherein the first layer comprises a first organic small molecule material; depositing a second layer on the first layer such that the second layer is in physical contact with the first layer, wherein the interface of the second layer on the first layer forms a bulk heterojunction; and depositing a second electrode over the second layer to form the optoelectronic device. In another embodiment, a first layer having protrusions is deposited over the first electrode, wherein the first layer comprises a first organic small molecule material. For example, when the first layer is an electron donor layer, the first electrode is an anode, the second layer is an electron acceptor layer, and the second electrode is a cathode. As a further example, when the first layer is an electron acceptor layer, the first electrode is a cathode, the second layer is an electron donor layer, and the second electrode is an anode.

33 Claims, 6 Drawing Sheets

U.S. PATENT DOCUMENTS

| | | | |
|---|---|---|---|
| 6,337,102 B1 * | 1/2002 | Forrest et al. | 427/64 |
| 6,352,777 B1 | 3/2002 | Bulovic et al. | |
| 6,420,031 B1 | 7/2002 | Parthasarathy et al. | |
| 6,451,415 B1 | 9/2002 | Forrest et al. | |
| 6,469,437 B1 | 10/2002 | Parthasarathy et al. | |
| 6,580,027 B2 | 6/2003 | Forrest et al. | |
| 6,646,284 B2 * | 11/2003 | Yamazaki et al. | 257/40 |
| 6,649,824 B1 * | 11/2003 | Den et al. | 136/256 |
| 6,653,701 B1 * | 11/2003 | Yamazaki et al. | 257/414 |
| 6,657,378 B2 | 12/2003 | Forrest et al. | |
| 6,670,213 B2 | 12/2003 | Halls et al. | |
| 6,852,555 B1 * | 2/2005 | Roman et al. | 438/22 |
| 6,995,445 B2 * | 2/2006 | Forrest et al. | 257/448 |
| 2001/0032665 A1 * | 10/2001 | Han et al. | 136/256 |
| 2002/0108649 A1 * | 8/2002 | Fujimori et al. | 136/263 |
| 2002/0197462 A1 * | 12/2002 | Forrest et al. | 428/212 |
| 2003/0042846 A1 * | 3/2003 | Forrest et al. | 313/503 |
| 2003/0066950 A1 * | 4/2003 | Halls et al. | 250/214.1 |
| 2003/0068528 A1 * | 4/2003 | Thompson et al. | 428/690 |
| 2004/0038251 A1 * | 2/2004 | Smalley et al. | 435/6 |
| 2004/0048000 A1 | 3/2004 | Shtein et al. | |
| 2004/0091738 A1 * | 5/2004 | Psai et al. | 428/690 |
| 2004/0121508 A1 * | 6/2004 | Foust et al. | 438/99 |
| 2005/0110007 A1 * | 5/2005 | Forrest et al. | 257/40 |
| 2006/0046504 A1 * | 3/2006 | Kayama et al. | 438/758 |

OTHER PUBLICATIONS

Yoshino, K. et al. "Novel Photovoltaic Devices Based on Donor-Acceptor Molecular and Conducting Polymer Systems." IEEE Trans. on Elect. Devices. vol. 44 (Aug. 1997): pp. 1315-1324.*

Forrest, "Ultrathin Organic Films Grown by Organic Molecular Beam Deposition and Related Techniques," Chem. Rev. 97, pp. 1793-1896 (1997).

Baldo et al., "Organic Vapor Phase Deposition," Adv. Mater. 10, 1505 (1998).

Peumans et al., "Efficient Photon Harvesting at High Optical Intensities in Ultrathin Organic Double-Heterostructure Photovoltaic Diodes," Applied Physics Letters, vol. 76, No. 19, pp. 2650-52 (2000).

Peumans et al., "Small molecular weight organic thin-film photodetectors and solar cells," J. Appl. Phys., vol. 93, No. 7, pp. 3693-3723 (Apr. 1, 2003).

Peumans et al., "Efficient bulk heterojunction photovoltaic cells using small-molecular-weight organic thin films," Nature, vol. 425, pp. 158-162 (Sep. 11, 2003).

G. Yu, et al., "Polymer Photovoltaic Cells: Enhanced Efficiencies via a Network of Internal Donor-Acceptor Heterojunctions", Science, vol. 270, pp. 1789-1791, Dec. 15, 1995.

F. Padinger et al., "Effects of Postproduction Treatment on Plastic Solar Cells", Adv. Funct. Mater. 2003, 13, No. 1, January, pp. 85-88.

<http://www.oksolar.com/solar_panels/unisolar_flexibles.htm>, "Uni-solar Flexible (USF) Unbreakable Solar Panels—Triple Junction", printed Sep. 14, 2004.

"Uni-Power Solar Electric Modules Specification Sheet, Models US-64, US-42, US-32", printed from the OKSolar.com website on Sep. 14, 2004 <http://www.oksolar.com/pdf/solar_energy_catalog/unisolar_us-64.pdf>.

"Amorphous Silicon (a-Si) Solar Technology", printed from United Solar Ovonic Corp. website on Sep. 14, 2004, <http://www.uni-solar.com/Our_Technology_a_Si.html>.

S. Guha, et al., "Amorphous Silicon Alloy Photovoltaic Research Present and Future", Progress in Photovoltaics: Research and Applications, Prog. Photovolt. Res. Appl. 8, pp. 141-150 (2000).

International Search Report dated Jan. 31, 2006, Application No. PCT/US2005/012928.

Kwong et al., "CUPC/C60 solar cells-influence of the indium tin oxide substrate and device architecture on the solar cell performance", Japanese J. Appl. Phys., vol. 43, No. 4A, pp. 1305-1311, Apr. 2004.

* cited by examiner

Fig. 3c CuPc/ITO (100°C)

Fig. 3b CuPc/Si (100°C)

Fig. 3a CuPc/Si (60°C)

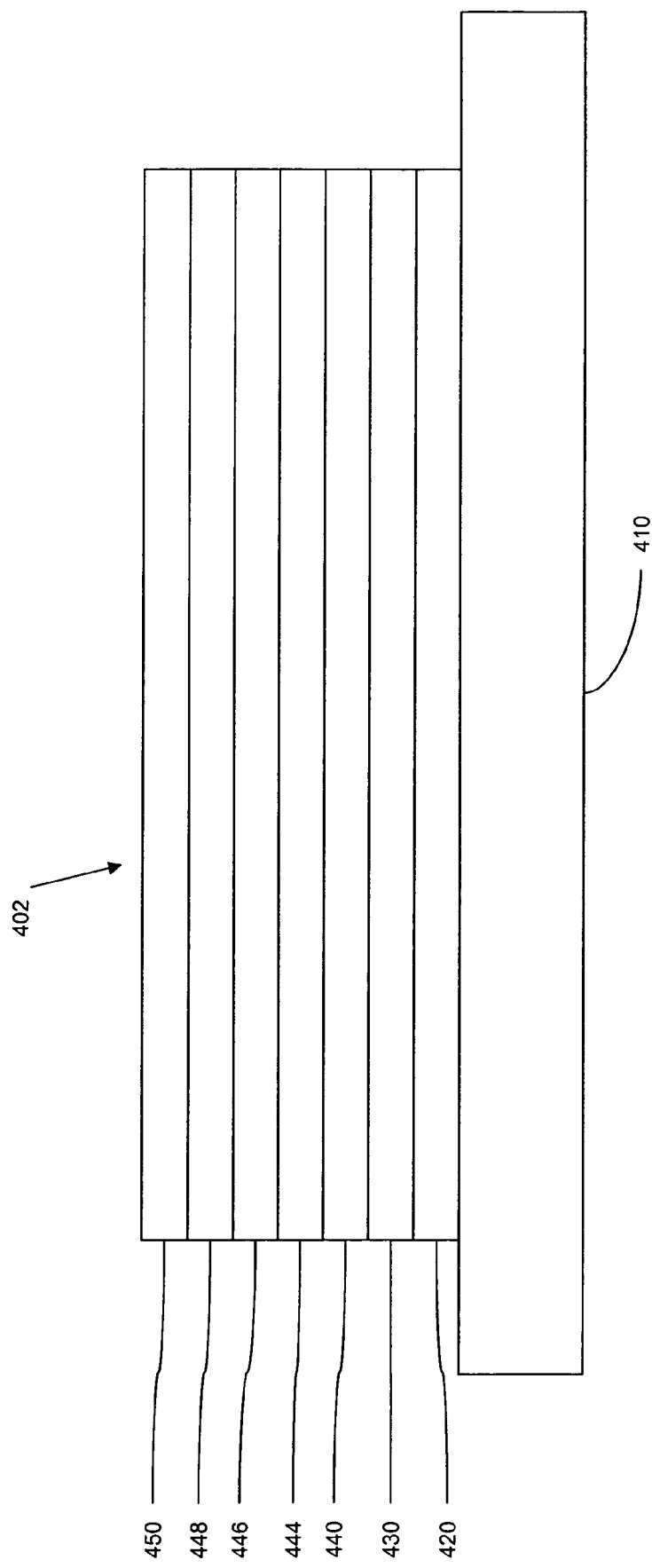

METHOD OF FABRICATING AN OPTOELECTRONIC DEVICE HAVING A BULK HETEROJUNCTION

UNITED STATES GOVERNMENT RIGHTS

This invention was made with U.S. Government support under Contract No. ACQ-1-30619-05 (Prime DE-AC36-98GO10337) awarded by the U.S. Department of Energy, National Renewable Energy Laboratory. The government has certain rights in this invention.

RESEARCH AGREEMENTS

The claimed invention was made by, on behalf of, and/or inconnection with one or more of the following parties to a joint university-corporation research agreement: Princeton University, The University of Southern California and Universal Display Corporation. The agreement was in effect on and before the data the claimed invention was made, and the claimed invention was made as a result of activities undertaken within the scope of the agreement.

FIELD OF THE INVENTION

The present invention generally relates to a method of fabricating an optoelectronic device. More specifically, it is directed to a method of fabricating an optoelectronic device including a bulk heterojunction.

BACKGROUND

Optoelectronic devices rely on the optical and electronic properties of materials to either produce or detect electromagnetic radiation electronically or to generate electricity from ambient electromagnetic radiation. Photosensitive optoelectronic devices convert electromagnetic radiation into electricity. Photovoltaic (PV) devices or solar cells, which are a type of photosensitive optoelectronic device, are specifically used to generate electrical power. PV devices, which may generate electrical power from light sources other than sunlight, are used to drive power consuming loads to provide, for example, lighting, heating, or to operate electronic equipment such as computers or remote monitoring or communications equipment. These power generation applications also often involve the charging of batteries or other energy storage devices so that equipment operation may continue when direct illumination from the sun or other ambient light sources is not available. As used herein the term "resistive load" refers to any power consuming or storing device, equipment or system. Another type of photosensitive optoelectronic device is a photoconductor cell. In this function, signal detection circuitry monitors the resistance of the device to detect changes due to the absorption of light. Another type of photosensitive optoelectronic device is a photodetector. In operation a photodetector has a voltage applied and a current detecting circuit measures the current generated when the photodetector is exposed to electromagnetic radiation. A detecting circuit as described herein is capable of providing a bias voltage to a photodetector and measuring the electronic response of the photodetector to ambient electromagnetic radiation. These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

More recently, optoelectronic devices that make use of organic materials have become increasingly desirable for a number of reasons. Many of the materials used to make such devices are relatively inexpensive, so organic optoelectronic devices have the potential for cost advantages over inorganic devices. In addition, the inherent properties of organic materials, such as their flexibility, may make them well suited for particular applications such as fabrication on a flexible substrate. Organic materials have manufacturing process advantages relative to inorganic thin-film technologies enabling the ability to apply organic material layers to plastic substrates. Examples of organic optoelectronic devices include organic light emitting devices (OLEDs), organic phototransistors, organic photovoltaic cells (OPVs), and organic photodetectors. As used herein, the term "organic" includes polymeric materials as well as small molecule organic materials that may be used to fabricate organic optoelectronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety.

OLEDs make use of thin organic films that emit light when voltage is applied across the device. OLEDs are becoming an increasingly interesting technology for use in applications such as flat panel displays, illumination, and backlighting. For OLEDs, the organic materials therein may have performance advantages over conventional materials. For example, the wavelength at which an organic emissive layer emits light may generally be readily tuned with appropriate dopants. Several OLED materials and configurations are described in U.S. Pat. Nos. 5,844,363, 6,303,238, and 5,707,745, which are incorporated herein by reference in their entireties.

OLED devices are generally (but not always) intended to emit light through at least one of the electrodes, and one or more transparent electrodes may be useful in an organic optoelectronic device. For example, a transparent electrode material, such as indium tin oxide (ITO), may be used as the bottom electrode. A transparent top electrode, such as disclosed in U.S. Pat. Nos. 5,703,436 and 5,707,745, which are incorporated herein by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" or "deposited over" a second layer, the first layer is disposed or deposited further away from the substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

Solar cells can be characterized by the efficiency with which they can convert incident solar power to useful electric power. Devices utilizing crystalline or amorphous silicon dominate commercial applications, and some have achieved efficiencies of 23% or greater under solar illumination. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. Due to the manufacturing and stability issues associated with crystalline or amorphous silicon devices, the cost of the electrical power produced per unit area has been high. The use of current inorganic solar cells is currently limited by their high manufacturing costs relative to the electrical power produced per unit area, as well as their high installation costs resulting from the cumbersome nature of the cell frames, the remainder of system equipment, and the panels themselves. Thus, a need exists for a more economical method of manufacturing PV cells having an acceptable quantum yield and therefore, power conversion efficiency.

More recent efforts have focused on the use of organic photovoltaic cells to achieve acceptable photovoltaic conversion efficiencies with economical production costs. In organic materials, light absorption leads to the formation of excitons, or bound electron-hole pairs, rather than the free electron-hole pairs produced in inorganic semiconductors. Efficient dissociation of excitons in organic materials occurs under strong electric fields, or at a donor-acceptor (DA) heterointerface where the differences in the electron affinities and the ionization potentials between the contacting organic materials are sufficiently large to overcome the exciton binding energy. The later mechanism has been employed to form an organic DA planar heterojunction (HJ) photovoltaic cell with a power conversion efficiency $\eta_P$~1%, which was limited by exciton diffusion lengths ($L_D \leq 100$ Angstroms) being much shorter than the optical absorption length ($L_A$~1000 Angstroms). Employing $C_{60}$ (see U.S. Pat. No. 6,580,027) as the acceptor material, which has $L_D$~400 Angstroms, a power conversion efficiency $\eta_P$~3.6% has been demonstrated. Because excitons generated within an exciton diffusion length of the DA heterojunction are subject to the electric field of the junction, they generally have a higher probability of dissociating efficiently. Conversely, excitons generated more than an exciton diffusion length from the DA heterojunction generally have a smaller probability of dissociating efficiently and contributing to device current. Bulk heterojunctions seek to create a highly interfolded or interpercolating network of the donor and acceptor materials such that an exciton generated by the absorption of incident radiation is likely close to a heterojunction and is likely to disassociate efficiently contributing to device current.

SUMMARY OF THE INVENTION

The present invention provides a method of fabricating an organic optoelectronic device having a bulk heterojunction. Examples of organic optoelectronic devices which may be fabricated by the method of the invention include, but are not limited to, organic light emitting devices (OLEDs), organic phototransistors, organic photovoltaic cells (OPVs) (or solar cells), and organic photodetectors.

According to an embodiment of the present invention, a method of fabricating an optoelectronic device comprises the steps of: depositing a first layer over a first electrode by organic vapor phase deposition, wherein the first layer comprises a first organic small molecule material; depositing a second layer on the first layer such that the second layer is in physical contact with the first layer, wherein the interface of the second layer on the first layer forms a bulk heterojunction; and depositing a second electrode over the second layer to form the optoelectronic device. For example, when the first layer is an electron donor layer, the first electrode is an anode, the second layer is an electron acceptor layer, and the second electrode is a cathode. As a further example, when the first layer is an electron acceptor layer, the first electrode is a cathode, the second layer is an electron donor layer, and the second electrode is an anode.

According to another embodiment of the present invention, a method of fabricating an optoelectronic device comprises the steps of: depositing a first layer having protrusions over a first electrode, wherein the first layer comprises a first organic small molecule material; depositing a second layer on the first layer such that the second layer is in physical contact with the first layer, wherein the interface of the second layer on the first layer forms a bulk heterojunction; and depositing a second electrode over the second layer to form the optoelectronic device. For example, when the first layer is an electron donor layer, the first electrode is an anode, the second layer is an electron acceptor layer, and the second electrode is a cathode. As a further example, when the first layer is an electron acceptor layer, the first electrode is a cathode, the second layer is an electron donor layer, and the second electrode is an anode.

It is an object of the present invention to provide a method for the fabrication of an optoelectronic device including a bulk heterojunction, wherein the method is conducive to continuous and so-called "roll-to-roll" manufacturing techniques, and results in optoelectronic devices having acceptable quantum yields and power conversion efficiencies.

Figure 1A:
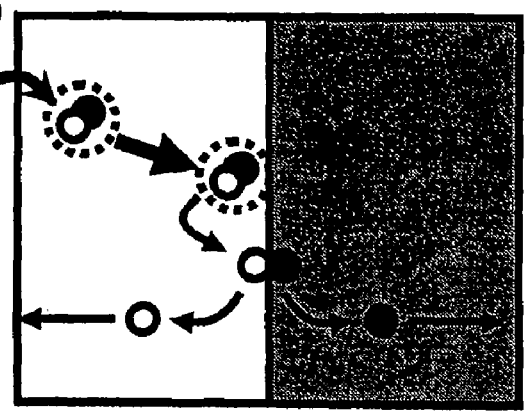
FIG. 1 shows schematic diagrams of the following types of organic donor-acceptor photovoltaic cells: (a) a bilayer cell; (b) a bulk heterojunction cell; and (c) a mixed-layer cell.

These figures are not necessarily drawn to scale.

DETAILED DESCRIPTION

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0+h\nu \Rightarrow S_0^*$. Here $S_0$ and $S_0^*$ denote ground and excited molecular states, respectively. This energy absorption is associated with the promotion of an electron from a bound state in the HOMO, which may be a $\pi$-bond, to the LUMO, which may be a $\pi^*$-bond, or equivalently, the promotion of a hole from the LUMO to the HOMO. In organic thin-film photosensitive optoelectronic material, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other, as opposed to recombination with holes or electrons from other pairs. To produce a photocurrent the electron-hole pair must become separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n-type or p-type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the highest occupied molecular orbital (HOMO) and the lowest unoccupied molecular orbital (LUMO), called the HOMO-LUMO gap. The Fermi energy characterizes the statistical occupation of molecular quantum energy states denoted by the value of energy for which the probability of occupation is equal to ½. A Fermi energy near the LUMO energy indicates that electrons are the predominant carrier. A Fermi energy near the HOMO energy indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

In the context of organic materials, the terms "donor" and "acceptor" refer only to the relative positions of the HOMO and LUMO energies of two contacting but different organic materials. If the LUMO energy of one material in contact with another is higher (i.e., its distance to the vacuum level is smaller), then that material is a donor. If the HOMO of one material relative to another is lower (same definition, but the HOMO is directly measured by the ionization potential, which is smaller for the lower HOMO), then that material is an acceptor.

A significant property in organic semiconductors is carrier mobility. Mobility measures the ease with which a charge carrier can move through a conducting material in response to an electric field. As opposed to free carrier concentrations, carrier mobility is determined in large part by intrinsic properties of the organic material such as crystal symmetry and periodicity. Appropriate symmetry and periodicity can produce higher quantum wavefunction overlap of HOMO levels producing higher hole mobility, or similarly, higher overlap of LUMO levels to produce higher electron mobility. Moreover, the donor or acceptor nature of an organic semiconductor, e.g., 3,4,9,10-perylenetetracarboxylic dianhydride (PTCDA), may be at odds with the higher carrier mobility. For example, while chemistry arguments suggest a donor-type character for PTCDA, experiments indicate that hole mobilities exceed electron mobilities by several orders of magnitude so that the hole mobility is a critical factor. The result is that device configuration predictions from donor/acceptor criteria may not be borne out by actual device performance. Due to these unique electronic properties of organic materials, rather than designating them as "n-type" or "p-type," the nomenclature of "hole-transporting-layer" (HTL) or "donor," or "electron-transporting-layer" (ETL) or "acceptor" is frequently used. In this designation scheme, an ETL will be preferentially electron conducting and an HTL will be preferentially hole transporting.

A typical prior art photovoltaic device configuration is the organic bilayer cell, a schematic diagram of which is shown in FIG. 1(a). In the bilayer cell, charge separation predominantly occurs at the organic heterojunction. The built-in potential at the heterojunction is determined by the HOMO-LUMO energy difference between the two materials contacting to form the heterojunction. The HOMO-LUMO gap offset between the donor and acceptor materials produce an electric field at the donor/acceptor interface that facilitates charge separation for excitons created within an exciton diffusion length of the interface.

The power conversion efficiency, $\eta_P$, of both small molecular weight and polymer organic photovoltaic cells has increased steadily in the last decade. This progress may be, to a great extent, attributed to the introduction of the donor-acceptor (DA) heterojunction which functions as a dissociation site for the strongly bound photogenerated excitons. Further progress was realized in polymer devices through use of blends of the donor and acceptor materials. Phase separation during spin-coating leads to a bulk heterojunction which removes the exciton diffusion bottleneck by creating an interpenetrating network of the donor and acceptor materials. However, the realization of bulk heterojunctions using mixtures of vacuum-deposited small molecular weight materials has been elusive since phase separation, induced by elevating the substrate temperature, leads to a significant roughening of the film surface and short-circuited devices.

The external quantum efficiency of an organic photosensitive optoelectronic device is based on exciton dissociation at a DA interface, i.e., $\eta_{EQE}=\eta_A \cdot \eta_{ED} \cdot \eta_{CC}$. Here, $\eta_A$ is the absorption efficiency. The diffusion efficiency, $\eta_{ED}$, is the fraction of photogenerated excitons that reaches a DA interface before recombining. The carrier collection efficiency, $\eta_{CC}$, is the probability that a free carrier, generated at a DA interface by dissociation of an exciton, reaches its corresponding electrode. Typically, in bilayer DA photovoltaic cells with a total thickness, L, on the order of the optical absorption length, $L_A$, we have $\eta_A=1-\exp(-L=L_A)>50\%$ if optical interference effects are ignored, and $\eta_{CC}\approx100\%$. However, since the exciton diffusion length ($L_D$) in organic materials is typically an order of magnitude smaller than $L_A$, a large fraction of the photogenerated excitons remains unused for photocurrent generation (see FIG. 1(a)). This provides a significant limit to $\eta_{EQE}$ and hence $\eta_P$ of this type of planar junction cell. Conversely, when L is less than or equal to $L_D$, $\eta_{ED}=100\%$ and thus $\eta_{EQE}$ is then limited by $\eta_A$.

Figure 1B:
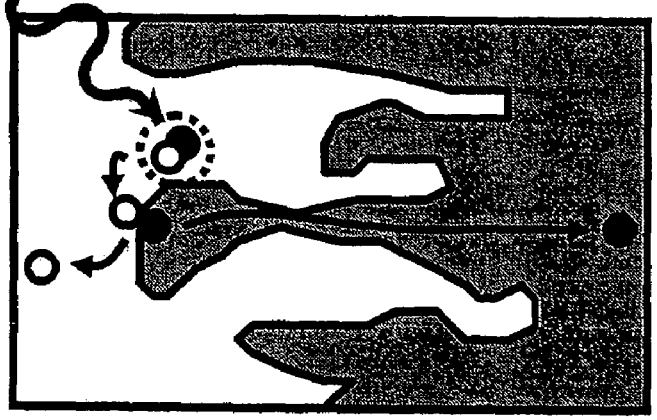

In polymer photovoltaic cells, the exciton diffusion bottleneck has been removed through the introduction of a bulk heterojunction. A schematic diagram of a bulk heterojunction is shown in FIG. 1(b). In a bulk heterojunction, the DA interface is highly folded such that photogenerated excitons are likely to find a DA interface within a distance $L_D$ of their generation site. Currently, state-of-the-art bulk heterojunction polymer photovoltaic cells have power conversion efficiencies of up to 3.5%. To date, the bulk heterojunction has been typically fabricated by spin-coating a mixture of soluble versions of the donor and acceptor materials. During spin coating and solvent evaporation, the donor and acceptor materials phase separate, creating an intricate interpenetrating network with a large interfacial area between the two phases. The morphology of the resulting structure is controlled by changing the spin conditions, solvents and relative material concentrations. The challenge of such systems is to balance a high $\eta_{ED}$, favoring finely grained morphologies, and a high $\eta_{CC}$ favoring coarse granularity, such that the product $\eta_{ED} \cdot \eta_{CC}$ is maximized.

Figure 1C:
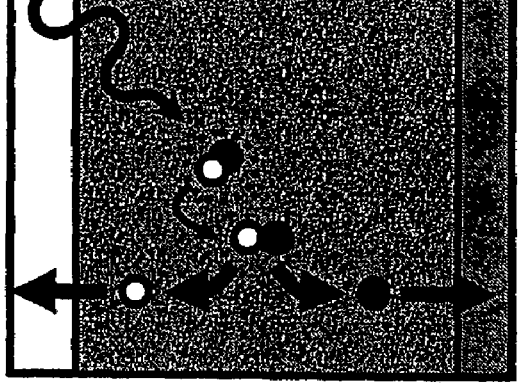

Currently, realizations of bulk heterojunctions in small molecular systems have been largely unsuccessful. Attempts to achieve a bulk heterojunction through co-deposition of the donor and acceptor materials have yielded devices with power conversion efficiencies falling short of those achievable in optimized bilayer devices using the same materials. Strong quenching of the photoluminescence in mixed materials indicates that $\eta_{ED}\sim100\%$. Therefore, the low efficiencies are attributed to poor charge transport, resulting in low carrier collection efficiencies, $\eta_{CC}$ (see FIG. 1(c)). If charge collection is assisted by the application of an external voltage, high external quantum efficiencies can be obtained.

Growth of mixed layers at elevated substrate temperatures leads to phase separation and the appearance of crystalline domains. However, this increase in crystallinity and possibly larger $L_D$ comes at the cost of an increased film roughness. The high density of pinholes leading to short circuits between cathode and anode contacts in such structures makes device fabrication impractical. The same problem occurs when mixed-layer films are annealed post-deposition to induce phase separation.

In accordance with the present invention, a method is provided for the fabrication of an organic optoelectronic device having a bulk heterojunction in a small molecule system. According to an embodiment of the invention, a first layer comprising an organic small molecule material is deposited over a first electrode by organic vapor phase deposition (OVPD).

Typically, the thin films of organic optoelectronic devices, such as OLEDs and OPVs, are grown by thermal evaporation in high vacuum, permitting the high degree of purity and structural control needed for reliable and efficient operation (see S. R. Forrest, *Chem. Rev.* 97, 1793 (1997)). However, control of film thickness uniformity and dopant concentrations over large areas needed for manufactured products can be difficult when using vacuum evaporation (see S. Wolf and R. N. Tauber, *Silicon Processing for the VLSI Era* (Lattice, 1986)). In addition, a considerable fraction of the evaporant coats the cold walls of the deposition chamber. Over time, inefficient use of materials results in a thick coating which can flake off, leading to particulate contamination of the system and substrate. The potential throughput for vacuum evaporated organic thin film devices is low, resulting in high production costs. Low-pressure organic vapor phase deposition (LP-OVPD) has been demonstrated recently as a superior alternative technique to vacuum thermal evaporation (VTE), in that OVPD improves control over dopant concentration of the deposited film, and is adaptable to rapid, particle-free, uniform deposition of organics on large-area substrates (see M. A. Baldo, M. Deutsch, P. E. Burrows, H. Gossenberger, M. Gerstenberg, V. S. Ban, and S. R. Forrest, *Adv. Mater.* 10, 1505 (1998)).

OVPD is inherently different from the widely used vacuum thermal evaporation (VTE), in that it uses a carrier gas to transport organic vapors into a deposition chamber, where the molecules diffuse across a boundary layer and physisorb on the substrate. This method of film deposition is most similar to hydride vapor phase epitaxy used in the growth of III-V semiconductors (see G. B. Stringfellow, *Organometallic Vapor-Phase Epitaxy* (Academic, London, 1989); G. H. Olsen, in GaInAsP, edited by T. P. Pearsall (Wiley, N.Y., 1982)). In LP-OVPD, the organic compound is thermally evaporated and then transported through a hot-walled gas carrier tube into a deposition chamber by an inert carrier gas toward a cooled substrate where condensation occurs. Flow patterns may be engineered to achieve a substrate-selective, uniform distribution of organic vapors, resulting in a very uniform coating thickness and minimized materials waste.

Virtually all of the organic materials used in thin film optoelectronic devices have sufficiently high vapor pressures to be evaporated at temperatures below 400° C. and then to be transported in the vapor phase by a carrier gas such as argon or nitrogen. This allows for positioning of evaporation sources outside of the reactor tube (as in the case of metalorganic chemical vapor deposition (see S. Wolf and R. N. Tauber, *Silicon Processing for the VLSI Era* (Lattice, 1986); G. B. Stringfellow, *Organometallic Vapor-Phase Epitaxy* (Academic, London, 1989))), spatially separating the functions of evaporation and transport, thus leading to precise control over the deposition process.

Figure 2:
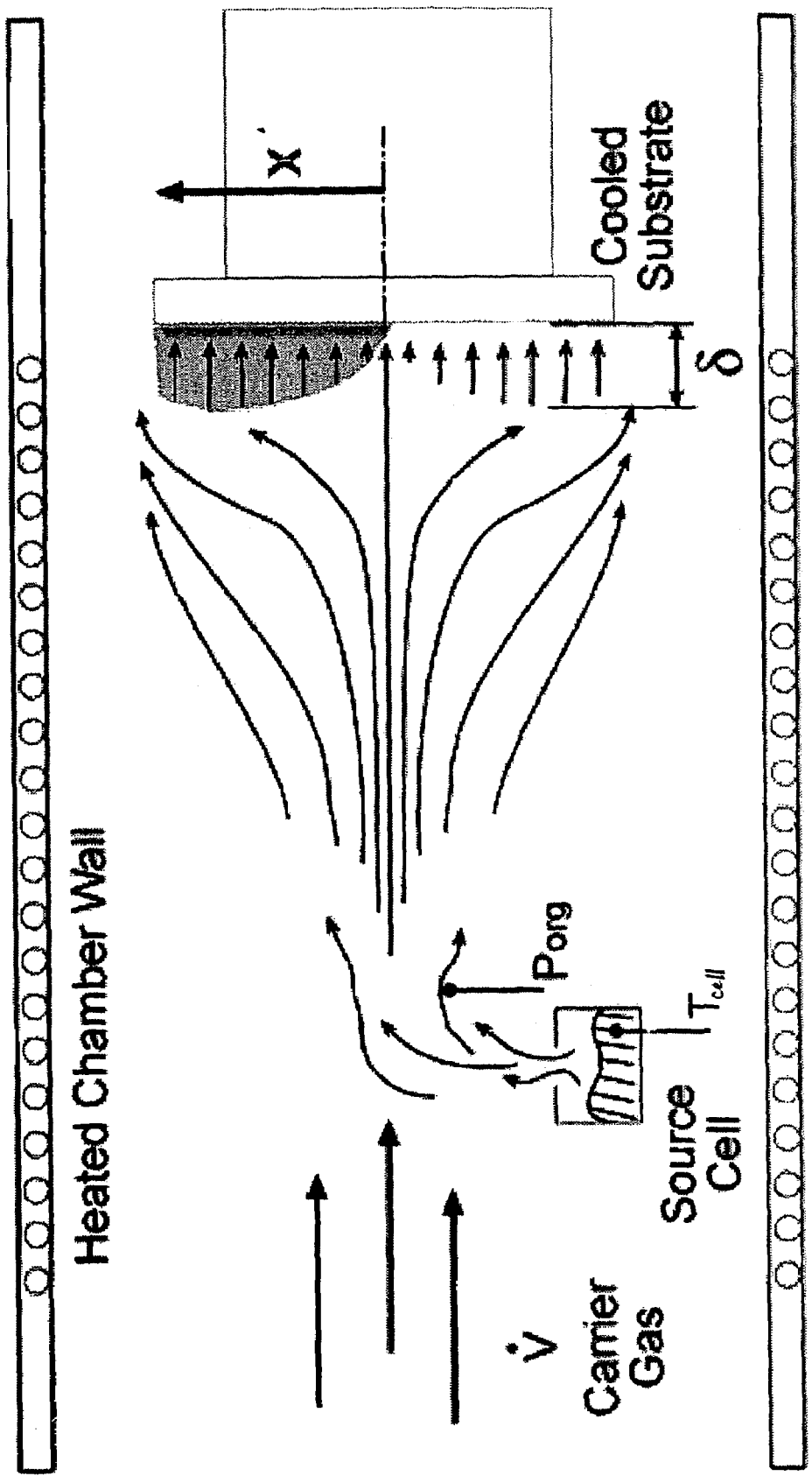
FIG. 2 shows a schematic diagram of organic vapor phase deposition (OVPD). OVPD takes place inside of a heated chamber and proceeds in three steps: evaporation from the source cell, entrainment of organic vapor by the carrier gas toward the substrate, and diffusion across the boundary layer to adsorb onto the substrate. The hot chamber walls and directed gas flow increase the deposition efficiency, prevent long-term contamination, and improve doping control.

The concept of OVPD is illustrated in FIG. 2. The process consists of three steps outlined below. Vapors of a species A are generated by heating the source material in a stream of an inert carrier gas. Gaseous A is subsequently transported into the deposition chamber by the carrier gas, where the flow forms a hydrodynamic boundary layer (BL) in the vicinity of the substrate. In the last step, organic molecules (present in typical concentrations of <0.01%) diffuse across the BL and physisorb or adsorb on the substrate. These three stages of transport may be represented as a series of reactions:

Evaporation:

(1a)

Entrainment by carrier gas:

(1b)

Transport to the substrate:

(2)

Diffusion to substrate surface:

(3a)

Surface diffusion and immobilization:

(3b)

where $A_s$ represents an organic molecular species in the solid or liquid state. Species $A_s$ and $A_g$ evaporate and recondense inside the source cell with characteristic rates $k_{evap}$ and $k_{cond}$, respectively. Evaporation takes place either in the so-called "kinetic" regime, where $k_{evap} > k_{cond}$, or is in an equilibrium regime, where $k_{evap} = k_{cond}$. The organic species is swept out of the source cell by the carrier gas in reaction (1b). Entrainment by the carrier results in taking $A_{cg}$ to the vicinity of the substrate with a characteristic bulk transport rate, $k_t$, where it becomes $A_{cg,s}$, with an overall efficiency of 100%, while the remainder is pumped out of the deposition chamber. Deposition takes place by diffusion of A across the boundary layer and adsorption with a characteristic rate $k_{ads}$. The overall deposition rate is $r_{dep} = k_{dep} - k_{des}$, where $k_{des}$ is the rate of desorption from the substrate.

U.S. Pat. No. 6,337,102 describes the basis for organic vapor phase deposition, and is incorporated herein by reference in its entirety. In addition, co-pending U.S. patent application publication no. 2004-0048000 A1 is incorporated herein by reference in its entirety. This co-pending U.S. patent application describes a device and method for organic vapor jet deposition which may be used in accordance with the method of the present invention.

Although the organic vapor phase deposition described in U.S. Pat. No. 6,337,102 employed conditions such that the resulting thin films were "characterized by superior surface properties such as low surface roughnesses" (U.S. Pat. No. 6,337,102, col. 2, lines 56-59), the organic vapor phase deposition of the present invention preferably employs conditions such that Stranski-Krastanov layer-plus-island growth occurs (see S. R. Forrest, *Chem. Rev.* 97, 1793 (1997)). That is, the organic vapor phase deposition of the present invention preferably employs sufficiently high substrate temperatures and deposition chamber pressures to produce a cohesive energy of the organic small molecule material such that the organic small molecule material tends to adhere to itself rather than the underlying substrate. This growth regime fosters the deposition of a first layer, comprising the organic small molecule material, having a sufficiently high surface area-to-volume ratio to form the bottom layer of a bulk heterojunction. Preferably, the surface area-to-volume ratio of the deposited first layer is at least 2:1, and more preferably is at least 5:1. These surface area and volume measurements may be made by microscopic techniques known in the art, such as for example, atomic force microscopy (AFM), scanning electron microscopy (SEM), or cross-sectional transmission electron microscopy (TEM) (which would be the preferred technique for a completely fabricated optoelectronic device). By increasing this surface area-to-volume ratio, the exciton dissociation probability, and hence the efficiency, of the fabricated optoelectronic device are increased. As used herein in the phrase "surface area-to-volume ratio," the term "surface area" does not refer to the entire surface area of the deposited first layer, but refers only to the surface area of the deposited first layer which will be in contact with the second layer deposited thereon (i.e., the interface of the first and second layers).

As would be understood by one of ordinary skill in the art, the temperatures and pressures to be employed during the organic vapor phase deposition will be dependent upon, inter alia, the organic materials being used. For example, when depositing a first layer comprising copper phthalocyanine (CuPc) as an electron donor layer over a first electrode, a preferred deposition chamber pressure is in the range of about 50 mTorr to about 10 Torr, a preferred source cell temperature is in the range of about 370° C. to about 470° C., and a preferred underlying substrate temperature is in the range of about 0° C. to about 100° C. The underlying substrate is the substrate underlying all of the deposited layers, and in practice, it is the temperature of the underlying substrate that is controlled during OVPD. However, because the layers deposited on the substrate are all relatively thin, the temperatures of these layers are approximately equal to the temperature of the underlying substrate, such that the temperature of the material on which the first layer is being deposited by OVPD is approximately equal to the temperature of the underlying substrate.

The use of organic vapor phase deposition to form a bulk heterojunction during the fabrication of an optoelectronic device offers advantages over previous methods of forming a bulk heterojunction. For instance, OVPD enables the direct deposition of separate layers to form a bulk heterojunction on a variety of substrates, including rolls of plastic, without the need for post-deposition annealing of the fabricated device. Ordinarily, plastic substrates cannot be subjected to the high temperatures required during post-deposition annealing. Thus, not only does the use of OVPD potentially lower the costs for fabricating optoelectronic devices having a bulk heterojunction by eliminating the need for post-deposition annealing, but it also allows for a broader range of substrates (i.e., plastic substrates) which can be used in conjunction with such fabrication.

According to another embodiment of the method of the invention, a first layer having protrusions is deposited over a first electrode, wherein the first layer comprises a first organic small molecule material. According to this embodiment, the first layer may be deposited via methods known in the art, such as vacuum deposition, vacuum thermal evaporation, spin coating, organic vapor phase deposition, inkjet printing and other known methods. Preferably, the deposition of the first layer having protrusions employs conditions such that Stranski-Krastanov layer-plus-island growth occurs (see S. R. Forrest, *Chem. Rev.* 97, 1793 (1997)). That is, the deposition of the first layer having protrusions preferably employs conditions which produce a cohesive energy of the first organic small molecule material such that the first organic small molecule material tends to adhere to itself rather than the underlying substrate. This growth regime fosters the deposition of a first layer, comprising the first organic small molecule material, having a sufficiently high surface area-to-volume ratio to form the bottom layer of a bulk heterojunction. Preferably, the surface area-to-volume ratio of the deposited first layer is at least 2:1, and more preferably is at least 5:1. By increasing this surface area-to-volume ratio, the exciton dissociation probability, and hence the efficiency, of the fabricated optoelectronic device are increased.

Preferably, the diameters of each of the protrusions of the deposited first layer are no less than about the exciton diffusion length ($L_{D1}$) in the first organic small molecule material which comprises the first layer. More preferably, the diameters of each of the protrusions of the deposited first layer are in the range of from about one to about five times the exciton diffusion length ($L_{D1}$) in the first organic small molecule material. Most preferably, the diameters of each of the protrusions of the deposited first layer are in the range of from about one-and-a-half to about three times the exciton diffusion length ($L_{D1}$) in the first organic small molecule material. These diameter measurements may be determined by microscopic techniques known in the art, such as for example, AFM, SEM, or cross-sectional TEM (which would be the preferred technique for a completely fabricated optoelectronic device). By depositing a first layer having protrusions with such diameters, the DA interface should be shaped such that the photogenerated excitons of the first layer will likely find a DA interface within a distance $L_{D1}$ of their generation site. Likewise, it is preferred that the second layer deposited thereon will be similarly shaped. That is, the protrusions of the deposited first layer will be homogeneously arranged such that the spaces between these protrusions will preferably correspond to reciprocal protrusions of the deposited second layer having diameters no less than about the exciton diffusion length ($L_{D2}$) in the second organic small molecule material which comprises the second layer, more preferably having diameters in the range of from about one to about five times $L_{D2}$, and most preferably having diameters in the range of from about one-and-a-half to about three times $L_{D2}$. By depositing a first layer having protrusions with such a homogeneous arrangement, the DA interface should be shaped such that the photogenerated excitons of the second layer will likely find a DA interface within a distance $L_{D2}$ of their generation site.

According to the method of the invention, after the first layer comprising a first organic small molecule material has been deposited over the first electrode, a second layer is then deposited on the first layer such that the second layer is in physical contact with the first layer, and the interface of the second layer on the first layer forms a bulk heterojunction. The second layer may be deposited via vacuum deposition, vacuum thermal evaporation, spin coating, organic vapor phase deposition, inkjet printing and other methods known in the art. Preferably, the top surface of the top organic layer, which may be the second layer, is relatively flat such that shunt-paths for the electrical current are avoided. When the first layer is deposited by OVPD, it is preferred that the second layer is deposited on the first layer also by OVPD. As would be understood by one of ordinary skill in the art, the temperatures and pressures to be employed during the OVPD of the second layer will be dependent upon the organic materials being used. For example, when depositing (by OVPD) a second layer comprising 3,4,9,10-perylenetetracarboxylic bis-benzimidazole (PTCBI) as an electron acceptor layer on a first layer comprising copper phthalocyanine (CuPc) as an electron donor layer, a preferred deposition chamber pressure is in the range of about 50 mTorr to about 10 Torr, a preferred source cell temperature is in the range of about 370° C. to about 470° C., and a preferred underlying substrate temperature is in the range of about 0° C. to about 100° C. As these preferred temperature and pressure ranges are the same as those employed for depositing a first layer comprising CuPc as an electron donor layer over a first electrode as previously described, such an OVPD process could be carried out in the same deposition chamber, which would help to expedite and economize the fabrication process.

Although layers of any thickness may be used in accordance with the method of the invention, several guidelines should be considered in the selection of preferred layer thicknesses when fabricating an optoelectronic device according to the method of the invention. It is desirable for the exciton diffusion length, $L_D$, to be greater than or comparable to the layer thickness, L, since it is believed that most exciton dissociation will occur at an interface. If $L_D$ is less than L, then many excitons may recombine before dissociation. It is further desirable for the total photoconductive layer thickness to be of the order of the electromagnetic radiation absorption length, $1/\alpha$ (where $\alpha$ is the absorption coefficient), so that nearly all of the radiation incident on the solar cell is absorbed to produce excitons. Furthermore, the photoconductive layer thickness should be as thin as possible to avoid excess series resistance due to the high bulk resistivity of organic semiconductors.

Accordingly, these competing guidelines inherently require tradeoffs to be made in selecting the thicknesses of the photoconductive organic layers of a photosensitive optoelectronic device. Thus, on the one hand, a thickness that is comparable or larger than the absorption length is desirable (for a single cell device) in order to absorb the maximum amount of incident radiation. On the other hand, as the photoconductive layer thickness increases, two undesirable effects are increased. One is that due to the high series resistance of organic semiconductors, an increased organic layer thickness increases device resistance and reduces efficiency. Another undesirable effect is that increasing the photoconductive layer thickness increases the likelihood that excitons will be generated far from the effective field at a charge-separating interface, resulting in enhanced probability of geminate recombination and, again, reduced efficiency. Therefore, a device configuration is desirable which balances between these competing effects in a manner that produces a high quantum efficiency for the overall device. For example, by using multiple stacked subcells, the photoconductive organic layers may be made very thin. In summary, by taking the above-noted competing effects into account, that is, the absorption length of the photoconductive materials in the device, the diffusion length of the excitons in these materials, the photocurrent generation efficiency of these excitons, and the resistivity of these materials, the thickness of the layers in a device may be adjusted so as to obtain a maximum internal quantum efficiency (and those parameters directly related thereto) for those particular materials for a given set of ambient radiation conditions.

As previously described, the interface of the second layer on the first layer forms a bulk heterojunction which produces an internally generated electric filed. Preferably, the bulk heterojunction is formed by an electron donor layer in physical contact with an electron acceptor layer. The material comprising the electron donor layer has an ionization potential that is smaller than that of the material comprising the electron acceptor layer. Furthermore, the ionization potential HOMO/LUMO gap of the electron donor layer must be smaller than that of the electron acceptor layer. Generally, the materials comprising the electron donor or electron acceptor layers should have the longest possible exciton diffusion length, and thus are preferably those materials which lend themselves to ordered stacking of the molecules, such as planar, aromatic molecules.

The electron acceptor layer may be comprised of, for example, perylenes, naphthalenes, fullerenes or nanotubules. A preferred electron acceptor material is 3,4,9,10-perylenetetracarboxylic bis-benzimidazole (PTCBI). Alternatively, the electron acceptor layer may be comprised of a fullerene material, such as buckminsterfullerene ($C_{60}$), as described in U.S. Pat. No. 6,580,027, which is incorporated herein by reference in its entirety.

The electron donor layer may be comprised of, for example, a pthalocyanine or a porphyrin, or a derivative or transition metal complex thereof. A preferred electron donor material is copper pthalocyanine (CuPc).

According to an embodiment of the method of the invention, a second electrode is deposited over the second layer to form the optoelectronic device. The second electrode may be deposited via methods known in the art, such as for example, vacuum deposition and spin coating. The electrodes, or contacts, used in a photosensitive optoelectronic device are an important consideration, as shown in U.S. Pat. No. 6,352,777, which is incorporated herein by reference in its entirety. When used herein, the terms "electrode" and "contact" refer to layers that provide a medium for delivering photogenerated power to an external circuit or providing a bias voltage to the device. That is, an electrode, or contact, provides the interface between the photoconductively active regions of an organic photosensitive optoelectronic device and a wire, lead, trace or other means for transporting the charge carriers to or from the external circuit. In a photosensitive optoelectronic device, it is desirable to allow the maximum amount of ambient electromagnetic radiation from the device exterior to be admitted to the photoconductively active interior region. That is, the electromagnetic radiation must reach a photoconductive layer, where it can be converted to electricity by photoconductive absorption. This often dictates that at least one of the electrical contacts should be minimally absorbing and minimally reflecting of the incident electromagnetic radiation. That is, such a contact should be substantially transparent. The opposing electrode may be a reflective material so that light which has passed through the cell without being absorbed is reflected back through the cell. As used herein, a layer of material or a sequence of several layers of different materials is said to be "transparent" when the layer or layers permit at least 50% of the ambient electromagnetic radiation in relevant wavelengths to be transmitted through the layer or layers. Similarly, layers which permit some, but less that 50% transmission of ambient electromagnetic radiation in relevant wavelengths are said to be "semi-transparent".

The electrodes are preferably composed of metals or "metal substitutes." Herein the term "metal" is used to embrace both materials composed of an elementally pure metal, e.g., Mg, and also metal alloys which are materials composed of two or more elementally pure metals, e.g., Mg and Ag together, denoted Mg:Ag. Herein, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO). In particular, ITO is a highly doped degenerate n+ semiconductor with an optical bandgap of approximately 3.2 eV, rendering it transparent to wavelengths greater than approximately 3900 Å. Another suitable metal substitute is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal." Thus, the metal substitute electrodes of the present invention may sometimes be referred to as "metal-free" wherein the term "metal-free" is expressly meant to embrace a material free of metal in its chemically uncombined form. Free metals typically have a form of metallic bonding that results from a sea of valence electrons which are free to move in an electronic conduction band throughout the metal lattice. While metal substitutes may contain metal constituents they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

Embodiments of the method of the present invention may include, as one or more of the transparent electrodes of the fabricated optoelectronic device, a highly transparent, non-metallic, low resistance cathode such as disclosed in U.S. Pat. Nos. 6,469,437, and 6,420,031 to Parthasarathy et al. ("Parthasarathy"), or a highly efficient, low resistance metallic/non-metallic compound cathode such as disclosed in U.S. Pat. Nos. 5,703,436, and 6,297,495 to Forrest et al. ("Forrest"). Each type of cathode is preferably prepared in a fabrication process that includes the step of sputter depositing an ITO layer onto either an organic material, such as copper phthalocyanine (CuPc), to form a highly transparent, non-metallic, low resistance cathode or onto a thin Mg:Ag layer to form a highly efficient, low resistance metallic/non-metallic compound cathode. Parasarathy discloses that an ITO layer onto which an organic layer had been deposited, instead of an organic layer onto which the ITO layer had been deposited, does not function as an efficient cathode.

Herein, the term "cathode" is used in the following manner. In a non-stacked photosensitive optoelectronic device or a single unit of a stacked photosensitive optoelectronic device under ambient irradiation and connected with a resistive load and with no externally applied voltage, e.g., a solar cell, electrons move to the cathode from the adjacent photoconducting material. Similarly, the term "anode" is used herein such that in a solar cell under illumination, holes move to the anode from the adjacent photoconducting material, which is equivalent to electrons moving in the opposite manner. It will be noted that as the terms are used herein, anodes and cathodes may be electrodes or charge transfer layers.

In another embodiment of the invention, the optoelectronic device may be fabricated over a substrate. For example, the first electrode may be over a substrate, such that when the first layer is deposited over the first electrode, the first layer is also deposited over the substrate. The substrate may be any suitable substrate that provides desired structural properties. The substrate may be flexible or rigid, and it may also be transparent, translucent or opaque. Plastic and glass are examples of preferred rigid substrate materials. Plastic and metal foils are examples of preferred flexible substrate materials. The substrate may be a semiconductor material in order to facilitate the fabrication of circuitry. For example, the substrate may be a silicon wafer upon which circuits are fabricated, capable of controlling optoelectronic devices subsequently deposited on the substrate. Other substrates may also be used. The material and thickness of the substrate may be chosen to obtain desired structural and optical properties.

In a further embodiment of the invention, the method of fabricating an optoelectronic device may include depositing one or more exciton blocking layers (EBLs) as described in U.S. Pat. Nos. 6,097,147, and 6,451,415; and in Peumans et al., *Applied Physics Letters* 2000, 76, 2650-52, all of which are incorporated herein by reference in their entireties. The EBL may be deposited via vacuum deposition, vacuum thermal evaporation, spin coating, organic vapor phase deposition, inkjet printing and other methods known in the art. Higher internal and external quantum efficiencies have been achieved by the inclusion of one or more EBLs to confine photogenerated excitons to the region near the dissociating interface and to prevent parasitic exciton quenching at a photosensitive organic/electrode interface. In addition to limiting the volume over which excitons may diffuse, an EBL can also act as a diffusion barrier to substances introduced during deposition of the electrodes. In some circumstances, an EBL can be made thick enough to fill pinholes or shorting defects which could otherwise render an organic PV device non-functional. An EBL can therefore help protect fragile organic layers from damage produced when electrodes are deposited onto the organic materials.

It is believed that the EBLs derive their exciton blocking property from having a LUMO-HOMO energy gap substantially higher than that of the adjacent organic semiconductor from which excitons are being blocked. Thus, the confined excitons are prohibited from existing in the EBL due to energy considerations. While it is desirable for the EBL to block excitons, it is not desirable for the EBL to block all charge. However, due to the nature of the adjacent energy levels, an EBL will necessarily block only one sign of charge carrier. By design, an EBL will always exist between two layers, usually an organic photosensitive semiconductor layer and an electrode or charge transfer layer. The adjacent electrode or charge transfer layer will be in context either a cathode or an anode. Therefore, the material for an EBL in a given position in a device will be chosen so that the desired sign of carrier will not be impeded in its transport to the electrode or charge transfer layer. Proper energy level alignment ensures that no barrier to charge transport exists, preventing an increase in series resistance. For example, it is desirable for a material used as a cathode side EBL to have a LUMO level closely matching the LUMO level of the adjacent acceptor material so that any undesired barrier to electrons is minimized.

It should be appreciated that the exciton blocking nature of a material is not an intrinsic property. Whether a given material will act as an exciton blocker depends upon the relative HOMO and LUMO levels of the adjacent organic photosensitive material. Therefore, it is not possible to identify a class of compounds in isolation as exciton blockers without regard to the device context in which they may be used. However, with the teachings herein one of ordinary skill in the art may identify whether a given material will function as an exciton blocking layer when used with a selected set of materials to construct an organic PV device.

In a preferred embodiment of the invention, an EBL is deposited between the electron acceptor layer and the cathode. A preferred material for the EBL comprises 2,9-dimethyl-4,7-diphenyl-1,10-phenanthroline (also called bathocuproine or BCP), which is believed to have a LUMO-HOMO separation of about 3.5 eV, or bis(2-methyl-8-hydroxyquinolinoato)-aluminum(R)phenolate ($Alq_2OPH$). BCP is an effective exciton blocker which can easily transport electrons to the cathode from the adjoining electron acceptor layer. Furthermore, if BCP is deposited by OVPD, a preferred source temperature for the BCP would be in the range of about 150° C. to about 250° C.

Embodiments of the method of the invention may also include the depositing of semi-transparent to transparent charge transfer layers. As described herein charge transfer layers are distinguished from donor and acceptor layers by the fact that charge transfer layers are frequently, but not necessarily, inorganic and they are generally chosen not to be photoconductively active. The term "charge transfer layer" is used herein to refer to layers similar to but different from electrodes in that a charge transfer layer only delivers charge carriers from one subsection of an optoelectronic device to the adjacent subsection.

In a further embodiment of the method of the invention, one or more the deposited layers may be treated with plasma prior to depositing the next layer. The layers may be treated, for example, with a mild argon or oxygen plasma. This treatment is beneficial as it reduces the series resistance.

In another embodiment of the method of the invention, a wetting layer is deposited over the first electrode, such that the first layer is deposited over the wetting layer (i.e., the wetting layer is between the first electrode and the first layer), and a planarizing layer is deposited over the second layer, such that the second electrode is deposited over the planarizing layer (i.e., the planarizing layer is between the second layer and the second electrode). The deposition of the wetting layer and the planarizing layer help to prevent pinhole formation in the thin films of the fabricated optoelectronic device. When depositing the second electrode on top of the previously deposited layers, electrical shorts can result due to the penetration of the second electrode into the pinholes and contact with the underlying first electrode. However, the deposition of the wetting layer and the planarizing layer help to prevent such electrical shorts from occurring. An exemplary material for the planarizing layer and the wetting layer is a film of 3,4-polyethylenedioxythiophene:polystyrenesulfonate (PEDOT:PSS).

According to this embodiment of the invention, the wetting layer and the planarizing layer may be deposited by methods known in the art, such as vacuum deposition, vacuum thermal evaporation, spin coating, organic vapor phase deposition, inkjet printing and other known methods. When employing OVPD to deposit the wetting layer and the planarizing layer, lower substrate temperatures and deposition chamber pressures than those used to deposit the first layer may be used.

Generally, the high bulk resistivities of organic photoconductors make it desirable to utilize relatively thin films of these materials when fabricating organic optoelectronic devices. However, thin photosensitive layers will absorb a smaller fraction of incident radiation, and thus the external quantum efficiency of thin-layer photoconductors may be lower than that of thick-layer photoconductors. The external quantum efficiency of thin-layer organic devices such as those described herein can be further enhanced, however, by a suitable design of the device geometry. Due to the thin photoactive layers of the devices described herein, device geometries which provide a means for increasing the effective thickness of the absorbant layers may be preferable. One such configuration is a stacked device as described in U.S. Pat. No. 6,657,378, which is incorporated herein by reference in its entirety. It should be understood that the method of the present invention can be used to fabricate stacked optoelectronic devices, such as for example those described in U.S. Pat. No. 6,657,378. As used herein, the terms "stack", "stacked", "multisection" and "multicell" refer to any optoelectronic device with multiple layers of a photoconductive material separated by one or more electrode or charge transfer layers. When the term "subcell" is used herein, it refers to an organic photosensitive optoelectronic construction. When a subcell is used individually as a photosensitive optoelectronic device, it typically includes a complete set of electrodes, i.e., positive and negative. In a stacked optoelectronic device, each of the subcells in the device may be electrically connected either in parallel or in series, depending on whether the current and/or voltage generated by the device is to be maximized. In some stacked configurations it is possible for adjacent subcells to utilize common, i.e., shared, electrode or charge transfer layers. In other cases, adjacent subcells do not share common electrodes or charge transfer layers, but are instead separated by an electron-hole recombination zone comprising, for example, metallic nanoclusters, nanoparticles or nanorods. Thus, a subcell may encompass the subunit construction regardless of whether each subunit has its own distinct electrodes or shares electrodes or charge transfer layers with adjacent subunits. Herein, the terms "cell", "subcell", "unit", "subunit", "section", and "subsection" are used interchangeably to refer to a photoconductive layer or set of layers and the adjoining electrodes or charge transfer layers.

As described above, in some stacked configurations, the individual subcells of the stacked devices are separated by an electron-hole recombination zone, such as disclosed in U.S. Pat. No. 6,657,378. This layer serves to prevent the formation of an inverse heterojunction between the acceptor layer of the front cell and the donor layer of the back cell. The layer between the individual subcells provides a recombination zone for electrons approaching from the front subcell and holes from the back subcell. The effective recombination of electrons from the front subcell and holes from the back subcell is necessary if a photo-induced current is to be achieved in the stacked device. Preferably, the electron-hole recombination zone comprises a thin metal layer. The metal is semi-transparent in order to allow light to reach the back cell(s). To this end, it is preferred that the metal layer be less than about 20 Å thick. It is especially preferred that the metal film be about 5 Å thick. It is believed that these ultra-thin metal films (~5 Å) are not continuous films but rather are composed of isolated metal nanoparticles, nanorods or nanoclusters. Surprisingly, although the ultra-thin metal layer is not continuous, it still provides an efficient layer for electron-hole recombination. Preferred materials for use in this layer include Ag, Li, LiF, Al, Ti, and Sn. Silver is a particularly preferred metal for this layer. Gold is not believed to be a good choice for this layer as it is not known to introduce mid-gap states. In an alternative embodiment of a stacked device, the electron-hole recombination zone comprises a region of electronically active defects which lead to rapid electron-hole recombination. The defects may be introduced by limited damage at this interface, for example, by heating, by controlled impurity introduction, or by exposure to energetic particles during the deposition of the relevant organic layers. The energetic particles may be excited, for example, thermally or by an RF plasma.

Figure 4:
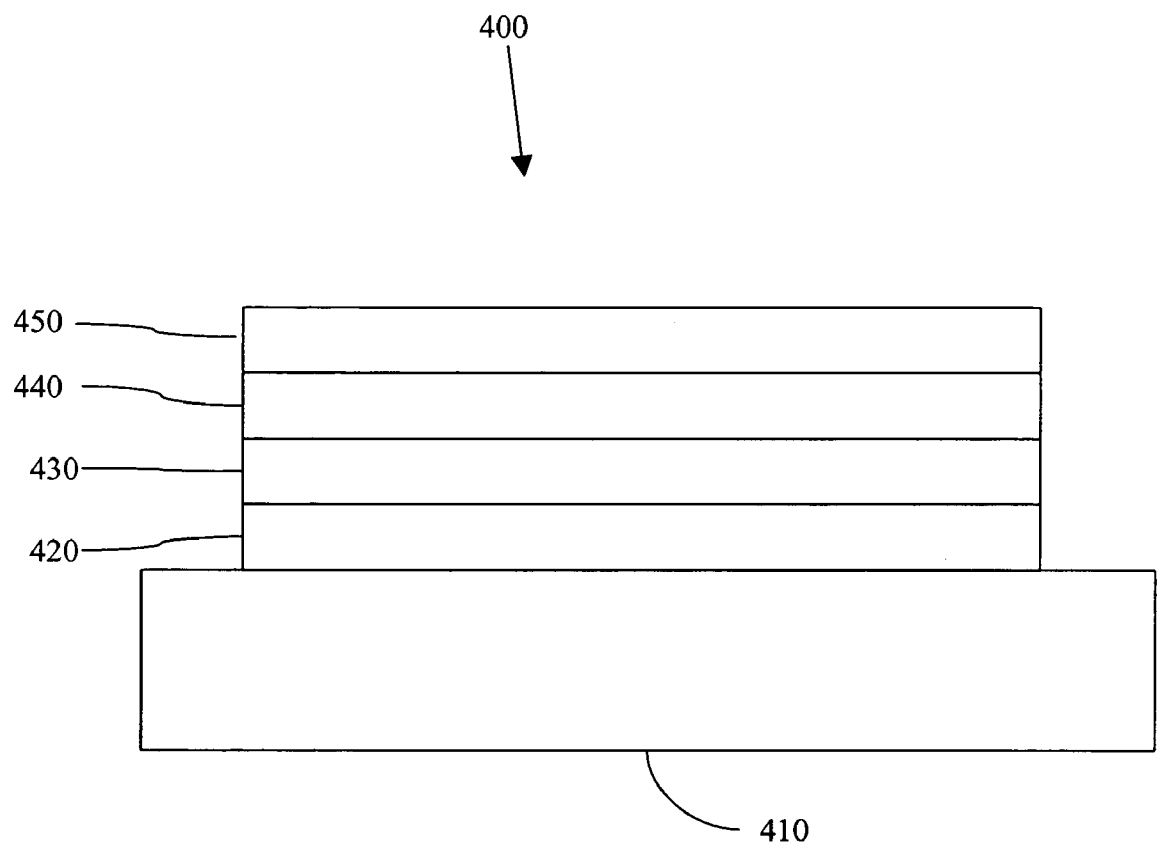
FIG. 4 shows a schematic diagram of an optoelectronic device produced by an embodiment of the method of the present invention.

FIG. 4 shows an optoelectronic device 400 produced by an embodiment of the method of the present invention. Device 400 may include a substrate 410, a first electrode 420, a first layer 430, a second layer 440, and a second electrode 450. This figure is not necessarily drawn to scale. For example, although the bulk heterojunction which is formed by the interface of the second layer 440 on the first layer 430 is represented by a solid line in FIG. 4, the bulk heterojunction is more accurately depicted by the schematic diagram of FIG. 1(b). A representative embodiment of the device 400 includes an anode as the first electrode 420, an electron donor layer as the first layer 430, an electron acceptor layer as the second layer 440, and a cathode as the second electrode 450. Another representative embodiment of the device 400 includes a cathode as the first electrode 420, an electron acceptor layer as the first layer 430, an electron donor layer as the second layer 440, and an anode as the second electrode 450.

Figure 5:
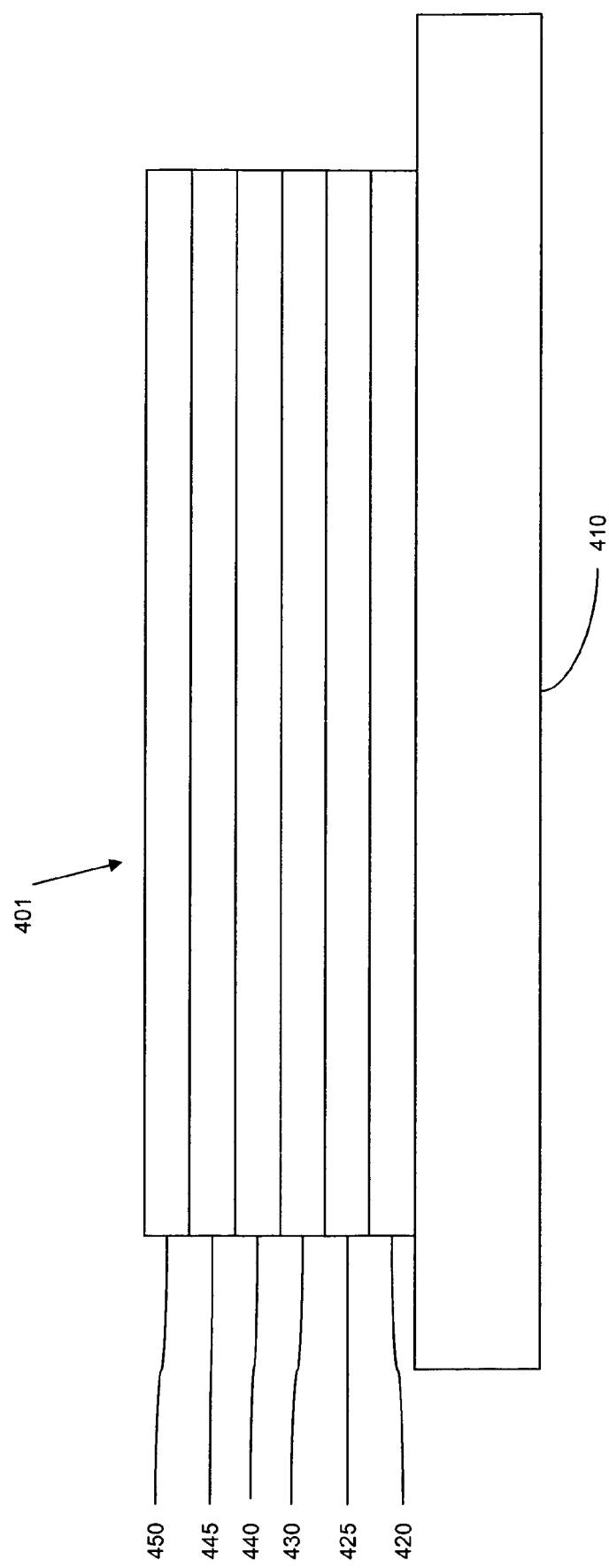

FIG. 5 shows an optoelectronic device 401 produced by an embodiment of the method of the present invention. Device 401 may include a substrate 410, a first electrode 420, a wetting layer 425, a first layer 430, a second layer 440, a planarizing layer 445, and a second electrode 450. This figure is not necessarily drawn to scale. For example, although the bulk heterojunction which is formed by the interface of the second layer 440 on the first layer 430 is represented by a solid line in FIG. 5, the bulk heterojunction is more accurately depicted by the schematic diagram of FIG. 1(b). A representative embodiment of the device 401 includes an anode as the first electrode 420, an electron donor layer as the first layer 430, an electron acceptor layer as the second layer 440, and a cathode as the second electrode 450. Another representative embodiment of the device 401 includes a cathode as the first electrode 420, an electron acceptor layer as the first layer 430, an electron donor layer as the second layer 440, and an anode as the second electrode 450.

FIG. 6 shows an optoelectronic device 402 produced by an embodiment of the method of the present invention. Device 402 may include a substrate 410, a first electrode 420, a first layer 430, a second layer 440, an electron-hole recombination zone 444, a third layer 446, a fourth layer 448, and a second electrode 450. This figure is not necessarily drawn to scale. For example, although the bulk heterojunction which is formed by the interface of the second layer 440 on the first layer 430 is represented by a solid line in FIG. 6, the bulk heterojunction is more accurately depicted by the schematic diagram of FIG. 1(b). A representative embodiment of the device 402 includes an anode as the first electrode 420, an electron donor layer as the third layer 446, an electron acceptor layer as the fourth layer 448, and a cathode as the second electrode 450. Another representative embodiment of the device 402 includes a cathode as the first electrode 420, an electron acceptor layer as the third layer 446, an electron donor layer as the fourth layer 448, and an anode as the second electrode 450.

According to other embodiments of the method of the invention, the first and second electrodes need not be included, and the deposition of the first and second layers as described above could be done over only a substrate. That is, in another embodiment of the invention, a method of forming a bulk heterojunction comprises depositing a first layer over a substrate by organic vapor phase deposition, wherein the first layer comprises a first organic small molecule material; and depositing a second layer on the first layer such that the second layer is in physical contact with the first layer, wherein the interface of the second layer on the first layer forms a bulk heterojunction. In a further embodiment of the invention, a method of forming a bulk heterojunction comprises depositing a first layer having protrusions over a substrate, wherein the first layer comprises a first organic small molecule material; and depositing a second layer on the first layer such that the second layer is in physical contact with the first layer, wherein the interface of the second layer on the first layer forms a bulk heterojunction.

It is understood that the various embodiments described herein are by way of example only, and are not intended to limit the scope of the invention. For example, many of the materials and structures described herein may be substituted with other materials and structures without deviating from the spirit of the invention. In addition, the method of the present invention may include other known processing steps used in the fabrication of optoelectronic devices. Also, it is understood that various theories as to why the invention works are not intended to be limiting. For example, theories relating to charge transfer are not intended to be limiting.

Experimental:

Specific representative embodiments of the invention will now be described. It is understood that the specific methods, materials, conditions, process parameters, apparatus and the like do not necessarily limit the scope of the invention.

EXAMPLE 1

Figure 3:
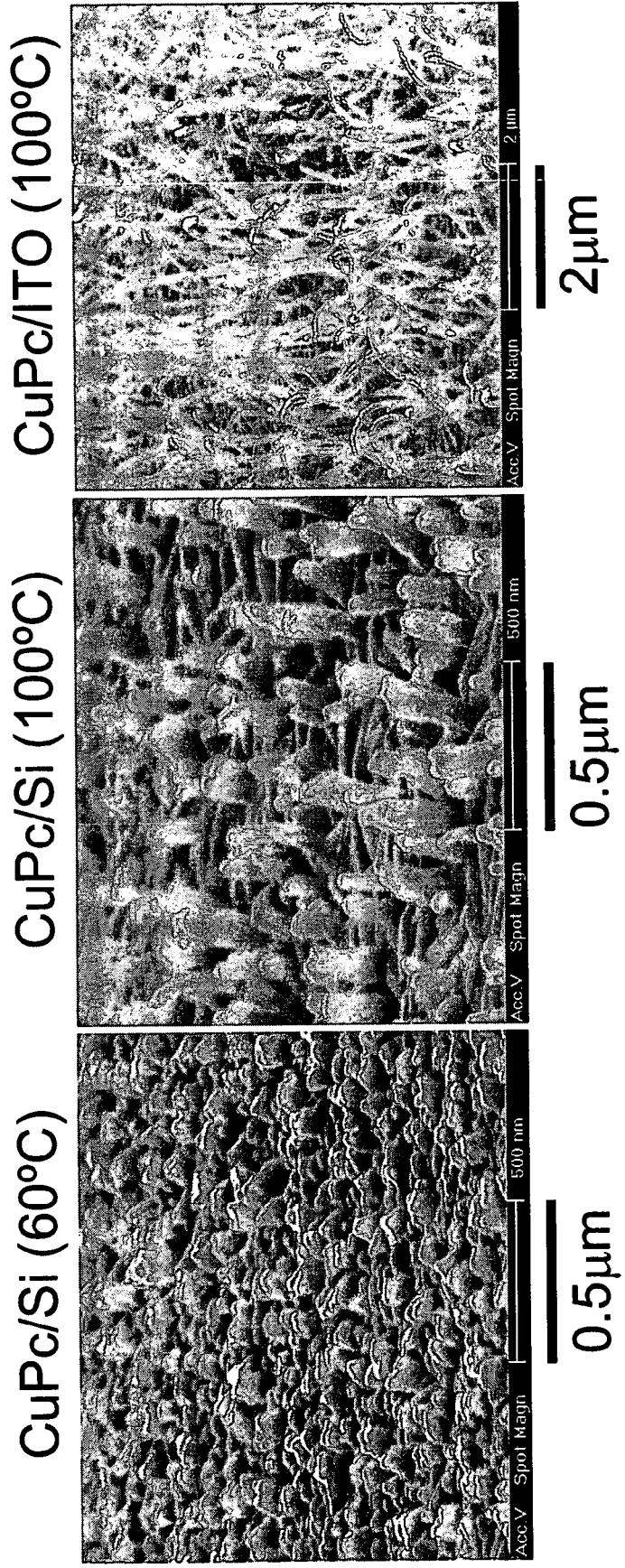
FIG. 3 shows scanning electron micrographs of the following layers deposited by organic vapor phase deposition: (a) CuPc deposited on silicon at an underlying substrate temperature of about 60° C.; (b) CuPc deposited on silicon at an underlying substrate temperature of about 100° C.; and (c) CuPc deposited on ITO at an underlying substrate temperature of about 100° C.

Organic vapor phase deposition was employed to deposit CuPc (an electron donor material) on silicon (a substrate) at an underlying substrate temperature of about 60° C. The deposited layer of CuPc had a high surface area-to-volume ratio, as can be seen in the scanning electron micrograph shown in FIG. 3(*a*).

EXAMPLE 2

Organic vapor phase deposition was employed to deposit CuPc (an electron donor material) on silicon (a substrate) at an underlying substrate temperature of about 100° C. The deposited layer of CuPc had a high surface area-to-volume ratio, as can be seen in the scanning electron micrograph shown in FIG. 3(*b*).

EXAMPLE 3

Organic vapor phase deposition was employed to deposit CuPc (an electron donor material) on indium-tin-oxide (an electrode) at an underlying substrate temperature of about 100° C. The deposited layer of CuPc had a high surface area-to-volume ratio, as can be seen in the scanning electron micrograph shown in FIG. 3(*c*).

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A method of forming a bulk heterojunction comprising:
depositing a first layer having protrusions over a substrate, wherein the first layer comprises a first organic small molecule material; and then
depositing a second layer on the first layer such that the second layer is in physical contact with the first layer, wherein the interface of the second layer on the first layer forms a bulk heterojunction having an interpenetrating network of the first and second layers, the interpenetrating network comprising the protrusions, the protrusions having diameters between 1 to 5 times the exciton diffusion length of the first organic small molecule material, and thereby being configured to enable dissociation of excitons.

2. A method of forming a bulk heterojunction comprising:
depositing a first layer over a substrate by organic vapor phase deposition, wherein the first layer comprises a first organic small molecule material; and
depositing a second layer on the first layer such that the second layer is in physical contact with the first layer, wherein the interface of the second layer on the first layer forms a bulk heterojunction having an interpenetrating network of the first and second layers, the interpenetrating network comprising regions having diameters between 1 to 5 times the exciton diffusion length of the first organic small molecule material, and thereby being configured to enable dissociation of excitons.

3. A method of fabricating an optoelectronic device, comprising:
depositing a first layer having protrusions over a first electrode, wherein the first layer comprises a first organic small molecule material; and then
depositing a second layer on the first layer such that the second layer is in physical contact with the first layer, wherein the interface of the second layer on the first layer forms a bulk heterojunction having an interpenetrating network of the first and second layers, the interpenetrating network comprising the protrusions, the protrusions having diameters between 1 to 5 times the exciton diffusion length of the first organic small molecule material, and thereby being configured to enable dissociation of excitons; and
depositing a second electrode over the second layer to form the optoelectronic device.

4. The method of claim 3, wherein the first layer is an electron donor layer, the first electrode is an anode, the second layer is an electron acceptor layer, and the second electrode is a cathode.

5. The method of claim 4, wherein the first electrode comprises ITO, the first layer comprises CuPc, and the second layer comprises PTCBI.

6. The method of claim 4, wherein the first electrode comprises ITO, the first layer comprises CuPc, and the second layer comprises $C_{60}$.

7. The method of claim 4, further comprising:
depositing an exciton blocking layer over the second layer, such that the second electrode is deposited over the exciton blocking layer.

8. The method of claim 7, wherein the exciton blocking layer comprises BCP.

9. The method of claim 3, wherein the first layer is an electron acceptor layer, the first electrode is a cathode, the second layer is an electron donor layer, and the second electrode is an anode.

10. The method of claim 3, wherein the diameter of the protrusions are between 1.5 to 3 times the exciton diffusion length of the first organic small molecule material.

11. The method of claim 3, wherein the cohesive energy of the first organic small molecule material is such that the first organic small molecule material tends to adhere to itself rather than an underlying substrate.

12. The method of claim 3, further comprising:
depositing the first layer over a substrate.

13. The method of claim 12, wherein the substrate comprises plastic.

14. The method of claim 3, further comprising:
depositing a wetting layer over the first electrode, such that the first layer is deposited over the wetting layer; and
depositing a planarizing layer over the second layer, such that the second electrode is deposited over the planarizing layer.

15. The method of claim 14, wherein the planarizing layer comprises PEDOT:PSS, and the wetting layer comprises PEDOT:PSS.

16. The method of claim 3, further comprising:
depositing an electron-hole recombination zone over the second layer;
depositing a third layer having protrusions over the electron-hole recombination zone, wherein the third layer comprises a third organic small molecule material;
depositing a fourth layer on the third layer such that the fourth layer is in physical contact with the third layer, wherein the interface of the fourth layer on the third layer forms a bulk heterojunction; and
depositing the second electrode over the fourth layer to form the optoelectronic device.

17. A method of fabricating an optoelectronic device, comprising:
depositing a first layer over a first electrode by organic vapor phase deposition, wherein the first layer comprises a first organic small molecule material;
depositing a second layer on the first layer such that the second layer is in physical contact with the first layer, wherein the interface of the second layer on the first layer forms a bulk heterojunction having an interpenetrating network of the first and second layers, the interpenetrating network comprising regions having diameters between 1 to 5 times the exciton diffusion length of the first organic small molecule material, and thereby being configured to enable dissociation of excitons; and
depositing a second electrode over the second layer to form the optoelectronic device.

18. The method of claim 17, wherein the first layer is an electron donor layer, the first electrode is an anode, the second layer is an electron acceptor layer, and the second electrode is a cathode.

19. The method of claim 18, further comprising:
depositing an exciton blocking layer over the second layer, such that the second electrode is deposited over the exciton blocking layer.

20. The method of claim 19, wherein the exciton blocking layer is deposited by organic vapor phase deposition, and comprises BCP.

21. The method of claim 17, wherein the first layer is an electron acceptor layer, the first electrode is a cathode, the second layer is an electron donor layer, and the second electrode is an anode.

22. The method of claim 17, wherein the first layer has a surface area-to-volume ratio of at least 2:1, wherein the surface area and volume are measured in micrometers.

23. The method of claim 22, wherein the first layer has a surface area-to-volume ratio of at least 5:1, wherein the surface area and volume are measured in micrometers.

24. The method of claim 17, wherein the second layer comprises a second organic small molecule material and is deposited by organic vapor phase deposition, wherein the organic vapor phase deposition of the first and second layers occurs at an underlying substrate temperature in the range of about 0° to about 100° C., and at a deposition chamber pressure in the range of about 50 mTorr to about 10 Torr.

25. The method of claim 24, wherein the first electrode comprises ITO, the first layer comprises CuPc, and the second layer comprises PTCBI.

26. The method of claim 24, wherein the first electrode comprises ITO, the first layer comprises CuPc, and the second layer comprises $C_{60}$.

27. The method of claim 17, wherein the cohesive energy of the first organic small molecule material is such that the first organic small molecule material tends to adhere to itself rather than an underlying substrate.

28. The method of claim 17, further comprising:
depositing the first layer over a substrate.

29. The method of claim 28, wherein the substrate comprises plastic.

30. The method of claim 17, further comprising:
depositing a wetting layer over the first electrode, such that the first layer is deposited over the wetting layer; and
depositing a planarizing layer over the second layer, such that the second electrode is deposited over the planarizing layer.

31. The method of claim 30, wherein the wetting layer and the planarizing layer are deposited by organic vapor phase deposition.

32. The method of claim 31, wherein the planarizing layer comprises PEDOT:PSS, and the wetting layer comprises PEDOT:PSS.

33. The method of claim 17, further comprising:
depositing an electron-hole recombination zone over the second layer;
depositing a third layer over the electron-hole recombination zone by organic vapor phase deposition, wherein the third layer comprises a third organic small molecule material;
depositing a fourth layer on the third layer such that the fourth layer is in physical contact with the third layer, wherein the interface of the fourth layer on the third layer forms a bulk heterojunction; and
depositing the second electrode over the fourth layer to form the optoelectronic device.

* * * * *

UNITED STATES PATENT AND TRADEMARK OFFICE
CERTIFICATE OF CORRECTION

| | |
|---|---|
| PATENT NO. | : 7,419,846 B2 |
| APPLICATION NO. | : 10/824288 |
| DATED | : September 2, 2008 |
| INVENTOR(S) | : Max Shtein, Fan Yang and Stephen R. Forrest |

It is certified that error appears in the above-identified patent and that said Letters Patent is hereby corrected as shown below:

Column 1, lines 15-22, please replace the paragraph under the heading "Joint Research Agreement" and replace with:

The claimed invention was made by, on behalf of, and/or in connection with one or more of the following parties to a joint university-corporation research agreement(s): Princeton University, The University of Southern California and Global Photonic Energy Corporation and/or Universal Display Corporation. The agreement(s) was in effect on and before the date the claimed invention was made, and the claimed invention was made as a result of activities undertaken within the scope of the agreement(s).

Signed and Sealed this

Seventeenth Day of March, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,419,846 B2 | Page 1 of 1 |
| APPLICATION NO. | : 10/824288 | |
| DATED | : September 2, 2008 | |
| INVENTOR(S) | : Max Shtein, Fan Yang and Stephen R. Forrest | |

It is certified that error appears in the above-identified patent and that said Letters Patent is hereby corrected as shown below:

Column 1, lines 7-11, please replace the paragraph under the heading "UNITED STATES GOVERNMENT RIGHTS" with:

This invention was made with U.S. Government support under Contract No. ACQ-1-30619-05 (Prime DE-AC36-98GO10337) awarded by the U.S. Department of Energy, National Renewable Energy Laboratory and granted by the Air Force Office of Science Research under Grant No. FA9550-04-1-0120. The government has certain rights in this invention.

Signed and Sealed this

Thirtieth Day of June, 2009

JOHN DOLL
*Acting Director of the United States Patent and Trademark Office*